US006858091B2

United States Patent
Boyd et al.

(10) Patent No.: US 6,858,091 B2
(45) Date of Patent: Feb. 22, 2005

(54) METHOD FOR CONTROLLING GALVANIC CORROSION EFFECTS ON A SINGLE-WAFER CLEANING SYSTEM

(75) Inventors: John M. Boyd, Atascadero, CA (US); Mike Ravkin, Sunnyvale, CA (US); Katrina A. Mikhaylich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 5 days.

(21) Appl. No.: 10/013,211

(22) Filed: Dec. 7, 2001

(65) Prior Publication Data

US 2003/0010361 A1 Jan. 16, 2003

Related U.S. Application Data

(60) Provisional application No. 60/305,372, filed on Jul. 13, 2001.

(51) Int. Cl.[7] .................................................. B08B 3/00
(52) U.S. Cl. .............................. 134/26; 134/32; 134/33; 134/902; 134/10
(58) Field of Search ........................... 134/10, 26, 32, 134/33, 902

(56) References Cited

U.S. PATENT DOCUMENTS

| 5,705,089 A | * | 1/1998 | Sugihara et al. ........... 252/79.1 |
| 6,152,153 A | | 11/2000 | Takase et al. |
| 6,247,479 B1 | | 6/2001 | Taniyama et al. |
| 6,265,781 B1 | * | 7/2001 | Andreas ..................... 257/765 |

FOREIGN PATENT DOCUMENTS

EP            1 039 506        9/2000

\* cited by examiner

*Primary Examiner*—Zeinab El-Arini
(74) *Attorney, Agent, or Firm*—Martine, Penilla & Gencarella, LLP (57) ABSTRACT

A method for minimizing galvanic corrosion effects in a single-wafer cleaning system is provided. The method initiates with spraying a cleaning chemistry containing corrosion inhibitors onto a surface of a wafer. Then, the surface of the wafer is exposed to the cleaning chemistry for a period of time. Next, a concentration gradient at an interface of the cleaning chemistry and the surface of the wafer is refreshed. Then, a rinsing agent and a drying agent are applied simultaneously to remove the cleaning chemistry, wherein the drying agent dries the surface of the wafer prior to a concentration of the corrosion inhibitors being diluted to a level insufficient to provide corrosion protection.

20 Claims, 8 Drawing Sheets

METHOD FOR CONTROLLING GALVANIC CORROSION EFFECTS ON A SINGLE-WAFER CLEANING SYSTEM

CROSS REFERENCE TO RELATED APPLICATIONS

This application claims priority from U.S. Provisional Patent Application No. 60/305,372 filed Jul. 13, 2001 and entitled "Drying substrate using a combination of substrate processing techniques." This provisional application is herein incorporated by reference.

BACKGROUND OF THE INVENTION

1. Field of the Invention

The invention relates generally to semiconductor manufacturing and more specifically to a cleaning method and apparatus for a single-wafer cleaning system which minimizes galvanic corrosion.

2. Description of the Related Art

Figure 1:
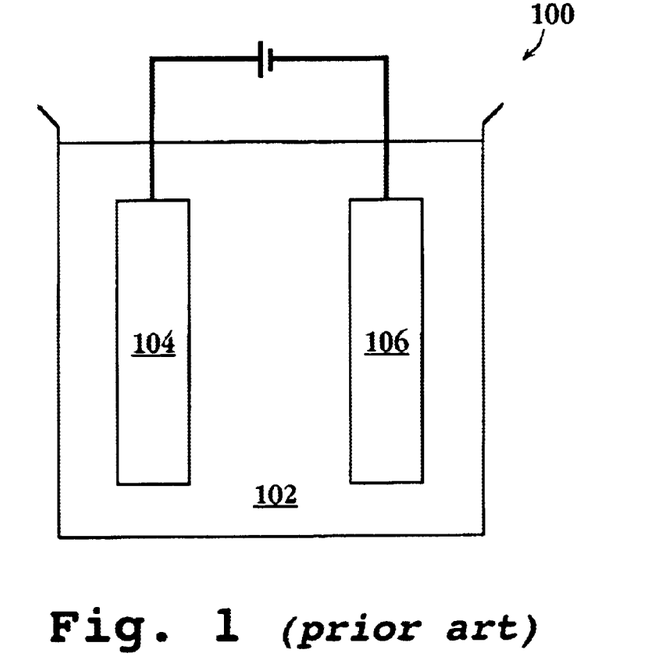
FIG. 1 illustrates prior art diagram of a basic galvanic cell.

Galvanic corrosion is induced in an environment where two dissimilar metals are coupled through an electrolyte. One of the metals in the galvanic cell becomes an anode and corrodes faster than it would normally, while the other metal becomes a cathode and corrodes slower than it would normally. FIG. 1 illustrates prior art diagram 100 of a basic galvanic cell. Two dissimilar metals, 104 and 106, are coupled through electrolyte 102. The anode 106 donates electrons and has its corrosion rate increased while the cathode 104 has its corrosion rate reduced.

Figure 2:
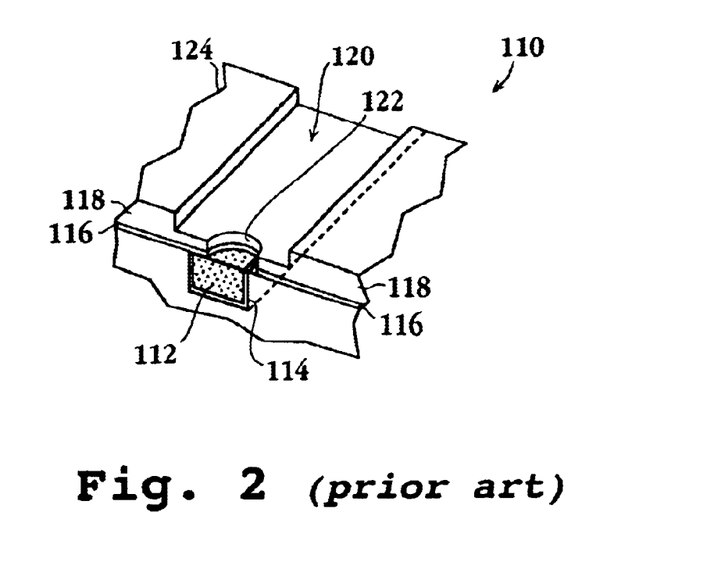
FIG. 2 illustrates prior art diagram depicting one example of where dissimilar metals can form a galvanic cell.

Metal interconnects used in semiconductors are often constructed from dissimilar metals such as Copper/Tantalum (Cu/Ta) or Copper/Tantalum Nitride (Cu/TaN). During cleaning operations following processing operations such as etch and chemical mechanical planarization (CMP), the dissimilar metals are brought into electrical contact through an electrolyte, such as water from an aqueous based cleaner or a semi-aqueous based cleaner. As a result, corrosion of one of the metals is accelerated, thereby creating the potential for device failure. FIG. 2 illustrates prior art diagram 110 depicting one example of where dissimilar metals can form a galvanic cell. Diagram 110 illustrates a dual damascene structure where trench 120 includes a via 122 down to copper metallization line 112. Liner 114 encases copper metalization line 112 around 3 sides and acts a copper diffusion barrier. Dielectric layer 118 is typically a low K dielectric disposed over barrier 116. As can be seen in diagram 110 the via 122 is slightly misaligned over copper metalization line 112. Consequently, two dissimilar metals are exposed, the copper of copper metallization line 112 and the liner 114 since liner 114 is typically tantalum or tantalum nitride for dual damascene applications. An additional misaligned via on a second metal line (not shown), which is not in contact with the metallization line 112, can also introduce the potential for a galvanic cell once the dissimilar metals exposed in isolated lines are brought into contact through an electrolyte. It should be appreciated that the via need not be misaligned as the copper can be brought into contact with a second metal exposed in a different region of substrate 124. Thus dissimilar metals of even perfectly aligned structures can be brought into contact through an electrolyte during cleaning and rinsing operations. Additionally, while a dual damascene structure is presented in diagram 110, traditional metallization processes using aluminum can also create the potential for a galvanic cell.

During cleaning operations, substrates are exposed to cleaning chemistries. In the case of single-wafer cleaning operations the cleaning chemistries are formulated to be fast acting and the stoichiometry of the components is critical to the performance of the cleaning chemistry. For example, semi-aqueous cleaning chemicals for single-wafer cleaning operations typically include a solvent to remove organic material, a chelator to enhance metal contaminant removal from surfaces exposed to sputtering from the etch process, and a surfactant to passivate sensitive surfaces, especially those vulnerable to corrosion. Examples of commercially available single-wafer cleaning chemistries used for post via etch applications include NE-89 from Ashland Inc. of Dublin, Ohio and EKC 640 from EKC Technology, Inc. of Hayward, Calif.

The surfactant of the cleaning chemicals for the single-wafer cleaning operations are formulated to help improve wetting of difficult-to-access features such as vias and contacts, and also to control galvanic effects where necessary, however, if the surfactant is diluted then its passivation capacity is reduced or inhibited, thereby leaving the substrate more vulnerable to galvanic corrosion effects. For example, where the cleaning chemistry is puddled on the substrate and then rinsed off with de-ionized (DI) water, the water acts as an electrolyte to initiate the mechanism for galvanic corrosion. The galvanic corrosion may occur within the first few seconds of rinsing, where the cleaning chemistry and the surfactant are initially diluted upon rinsing of the cleaning chemistry. The dilution of the cleaning chemistry upsets a chemical equilibrium established to protect the substrate surface from corrosion. Since the surfactant concentration is modified by dilution through rinsing, the semiconductor substrate is vulnerable to corrosion when the diluted surfactant concentration is insufficient to inhibit corrosion.

Figure 3:
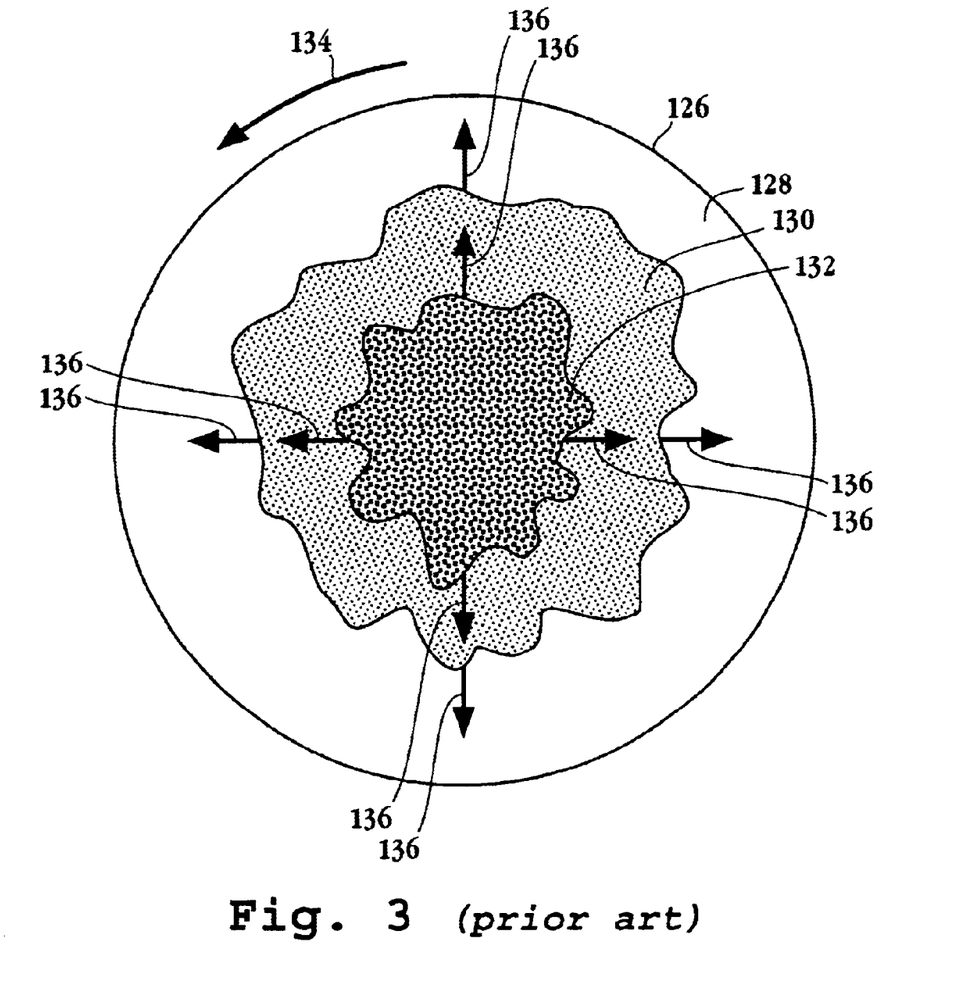
FIG. 3 illustrates a prior art diagram displaying the various concentration gradient regions formed during the rinsing operations from a vantage point above the substrate.

FIG. 3 illustrates a prior art diagram displaying the various concentration gradient regions formed during the rinsing operations from a vantage point above the substrate 126. Substrate 126 is spinning in the direction of arrow 134. Region 128 depicts the region containing the cleaning chemistry puddled onto the substrate 126 through a nozzle or other delivery mechanism (not shown). To rinse of the cleaning chemistry from the substrate 126, DI water is sprayed onto the substrate 126 through a nozzle (not shown) directed toward the outer edge of the substrate 126 while the substrate is spinning. As the DI water is sprayed on the substrate 126, regions of differing gradients will form on the substrate 126. Region 130 contains a mixture of the cleaning chemistry and DI water, which forms as the DI water is initially sprayed onto the substrate 126. After a period of time, enough DI water is sprayed onto the substrate 126 where the cleaning chemistry is displaced and region 132 containing only DI water forms. While FIG. 3 provides a snapshot of one instance during the rinsing process, it should be appreciated that the edges of regions 132 and 130 are moving toward the edge of substrate 126 as depicted by arrows 136. The DI water rinse continues until eventually all of the cleaning chemistry is displaced from the substrate 126.

As mentioned above, region 130 includes a mixture of cleaning chemistry and DI water. Thus, the chemical equilibrium under which the cleaning chemistry is designed to function has been shifted. As a result of the dilution of the surfactant by the DI water, the corrosion protection of the surfactant is inhibited, which in turn exposes the substrate 126 to the effects of galvanic corrosion. As mentioned above, the effects of corrosion, especially galvanic corrosion, can occur within seconds.

In view of the foregoing, there is a need to provide an apparatus and method to rinse the cleaning chemistry from a substrate in a manner which protects the exposed metals of the substrate from galvanic corrosion.

SUMMARY OF THE INVENTION

Broadly speaking, the present invention fills these needs by providing an apparatus and a method which quickly removes the cleaning chemistry from the surface of a semiconductor substrate. It should be appreciated that the present invention can be implemented in numerous ways, including as an apparatus, a system, a device, or a method. Several inventive embodiments of the present invention are described below.

In one embodiment, a method for minimizing galvanic corrosion effects in a single-wafer cleaning system is provided. The method initiates with applying a cleaning chemistry containing corrosion inhibitors to a surface of a wafer. Then, the surface of the wafer is exposed to the cleaning chemistry for a period of time. Next, a concentration gradient at an interface of the cleaning chemistry and the surface of the wafer is refreshed. Then, a rinsing agent and a drying agent are applied simultaneously to remove the cleaning chemistry, wherein the drying agent dries the surface of the wafer prior to a concentration of the corrosion inhibitors being diluted to a level insufficient to inhibit corrosion.

In another embodiment, a method for quickly drying a surface of a semiconductor substrate is provided. The method initiates with applying a cleaning chemistry including a surfactant to the surface of the semiconductor substrate. Then, the surface of the semiconductor substrate is exposed to the cleaning chemistry for a defined time period. Next, a rinsing agent and a drying agent are applied simultaneously to the surface of the semiconductor substrate to remove the cleaning chemistry, wherein the drying agent inhibits the rinsing agent from forming a diluted region of the cleaning chemistry from residing on the surface of the semiconductor substrate for a time period sufficient to allow corrosion of the substrate.

In yet another embodiment, a chemical sequencing method for single-wafer cleaning of a residue on a surface of a semiconductor substrate is provided. The chemical sequencing method is configured to maintain a concentration gradient at an interface between a cleaning chemistry and a residue on the semiconductor substrate. The method initiates with applying a cleaning chemistry to the surface of the semiconductor substrate. Then, the cleaning chemistry is allowed to react with the residue. Next, the cleaning agent is removed to reduce exposure of the semiconductor substrate to corrosion. Then, the applying, the allowing and the removing steps are repeated such that the concentration gradient is refreshed to more effectively remove the residue on the surface of a semiconductor substrate.

In still another embodiment, a method for minimizing galvanic corrosion effects in a single-wafer cleaning system while maintaining a concentration gradient at an interface between a cleaning chemistry and a residue on a wafer is provided. The method initiates with applying the cleaning chemistry containing corrosion inhibitors to a surface of a wafer. Then, the surface of the wafer is exposed to the cleaning chemistry for a period of time. Next, a concentration gradient at an interface of the cleaning chemistry and the surface of the wafer is refreshed. Then, the wafer is rinsed with the cleaning chemistry and simultaneously dried with a drying agent to remove the cleaning chemistry and dry the wafer.

In another embodiment, a system for cleaning a single substrate is provided. The system includes a spindle adapted to support the substrate where the spindle is configured to spin the substrate. A substrate surface having a layer of a cleaning chemistry disposed thereover is included. A first nozzle positioned over the substrate surface is also included. The first nozzle is configured to apply a rinsing agent on the substrate surface while the substrate is spinning. A second nozzle positioned over the substrate surface is included. The second nozzle is configured to apply a drying agent on the substrate surface while the first nozzle is applying the rinsing agent. A dispense arm to which the first and second nozzles are rigidly attached is included. The dispense arm is configured to advance radially above the substrate surface from a center of the substrate to an edge of the substrate while the substrate is spinning and while the first and second nozzles are applying the rinsing agent and the drying agent, respectively. The substrate surface is dried quickly to reduce exposure of the substrate surface to corrosion. Alternative configurations can be incorporated to increase the speed of rinsing and drying, such as incorporating multiple nozzle pairs.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described which provides a method and apparatus for removing a cleaning chemistry from the surface of a semiconductor substrate without exposing the substrate to corrosion effects during a single-wafer cleaning operation. In addition, the method and apparatus provide a more effective means for removing the residue during cleaning operations without increasing the consumption of the cleaning chemistry. It will be obvious, however, to one skilled in the art, that the present invention may be practiced without some or all of these specific details. In other instances, well known process operations have not been described in detail in order not to obscure the present invention.

The embodiments of the present invention provide a method and apparatus for applying and removing a cleaning agent from a semiconductor substrate without exposing the substrate to galvanic corrosion effects. In one embodiment, the precisely formulated cleaning chemistry applied to the semiconductor substrate is removed in a manner to reduce dilution of the components of the cleaning chemistry. In another embodiment, the cleaning chemistry includes a surfactant to inhibit corrosion. As used herein, surfactant also refers to corrosion inhibitors. The cleaning chemistry is removed from the surface of the semiconductor substrate in a manner where the dilutive effects of the rinsing agent are counteracted by quickly removing the cleaning chemistry from the surface of the substrate. By quickly drying the surface of the substrate during the rinsing process, the semiconductor remains protected from corrosion.

In addition, a method and apparatus for more effectively removing the cleaning chemistry from the surface of the semiconductor substrate during single-wafer cleaning is provided in another embodiment. The fast acting formulations of the cleaning chemistries for single-wafer cleaning processes perform optimally when a concentration gradient between the cleaning chemistry and the residue to be removed at the surface of the semiconductor substrate is maintained by removal of the boundary layer formed from reaction of the cleaning chemistry with the residue. More particularly, the retarding effects of the reactant species produced by the interaction of the cleaning chemistry and the residue is minimized by a chemical sequencing process to refresh the cleaning chemistry in order to maintain the concentration gradient. The refreshing process can include removing cleaning chemistry from the surface of the substrate and replacing it with fresh cleaning chemistry or continually recycling the cleaning chemistry to maintain the concentration gradient as will be discussed in more detail below.

Figure 4:
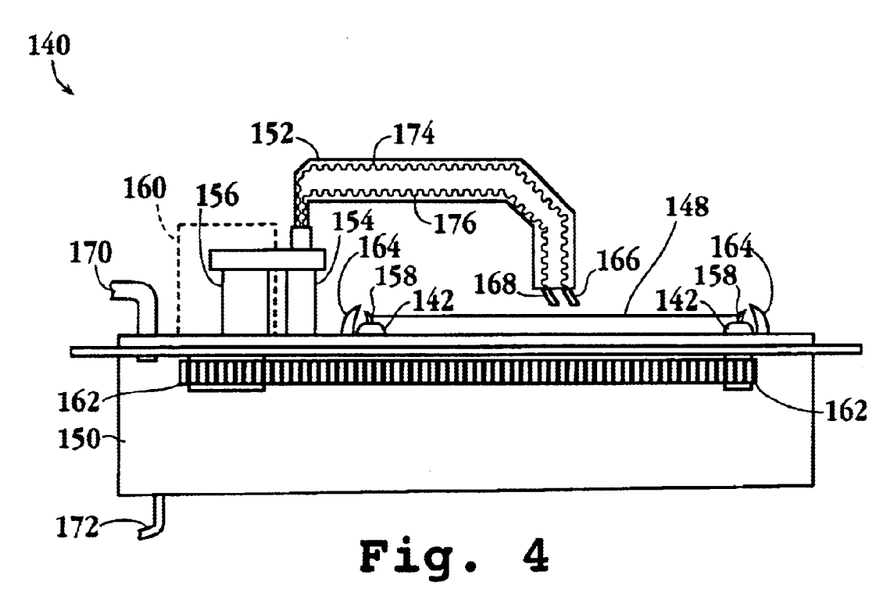
FIG. 4 illustrates an exemplary drying system in accordance with one embodiment of the invention.

FIG. 4 illustrates an exemplary drying system 140 in accordance with one embodiment of the invention. The drying system 140 includes a hollow spindle 142 configured to hold a substrate 148 and disposed within and over a drip tray 150. Dispense arm 152 is positioned over a top surface of the substrate 148. Dispense arm 152 is supported by dispense arm support post 154 which is mechanically connected (not shown) to a dispense arm drive shaft (not shown) disposed within a dispense arm drive shaft housing 156. Substrate 148 is affixed to hollow spindle 142 with fingers 158. Hollow spindle 142 is configured to rotate, which in turn rotates the substrate 148. Spindle motor 160 is configured to provide rotational energy which is applied to hollow spindle 142 with drive belt 162, which spins the substrate 148 locked to the hollow spindle 142 in fingers 158.

Surrounding hollow spindle 142, fingers 158, and substrate 148 is spray shield 164. Spray shield 164 is configured to contain any liquid from the rinsing and drying process to the region around hollow spindle 142. In one embodiment of the invention, spray shield 164 is configured with a door (not shown) that is magnetically coupled to a semi-circular pneumatic system to provide lateral access to the hollow spindle 142 for the insertion and removal of substrates 148.

In another embodiment of the invention, a rinsing agent and a drying agent are simultaneously applied to the top surface of substrate 148. The rinsing agent is applied through nozzle 166 and the drying agent is applied through nozzle 168 in one embodiment. Examples of rinsing agents include de-ionized water (DIW) and Isopropyl alcohol. Examples of drying agents include isopropyl alcohol (IPA), IPA vapor, heated Nitrogen ($N_2$) gas, and other inert gasses or vaporized chemicals. Some drying agents produce by-products or result in excess vapors that can become trapped within drip tray 150. An exhaust 170 is provided for the release of airborne chemicals or vapors, and a drain 172 is provided to drain any liquid residue of both cleaning and drying agents.

Dispense arm 152 provides for the supply of rinsing and drying agents through dispense nozzles 166 and 168 to the substrate 148 positioned in fingers 158 on the hollow spindle 142. The drying agent and the rinsing agent are supplied from separate reservoirs (not shown) and are routed along dispense arm 152 to dispense nozzles 168 and 166, respectively. Nozzles 166 and 168 direct streams of drying agent and the rinsing agent to a top surface of substrate 148.

In one embodiment, positioning of the dispense arm 152 across the top and surface of substrate 148 is controlled by a dispense arm controller (not shown) and a dispense arm drive shaft (not shown) contained within a dispense arm drive shaft housing 156. The dispense arm drive shaft is mechanically connected to the dispense arm support post 154 providing a direct mechanical connection between the drive shaft and the dispense arm 152 to position the dispense arm 152. The dispense arm 152 is configured to pivot about the dispense arm support post 154 to move the dispense arm 152 and move the dispense nozzles 166 and 168 radially across a top surface of a substrate. In one embodiment of the invention, the rinsing and drying agents are dispensed along a radius of a spinning substrate from a center region of the substrate to a peripheral region of the substrate. The dispense arm 152 is therefore moved along the surface of the spinning substrate from the center region outward to a peripheral region. In another embodiment, the nozzles 166 and 168 are positioned so that the drying agent is applied to the surface of the substrate directly behind the rinsing agent as the dispense arm 152 traverses across the surface the substrate 148. As will be described in more detail below, applying the drying agent simultaneously with the rinsing agent and in a manner which quickly dries the surface of the substrate 148 in a single-wafer cleaning operation protects the substrate from corrosion effects. It should be appreciated that FIG. 4 is provided as an exemplary illustration of one embodiment of an apparatus and not meant to be limiting.

Figure 5:
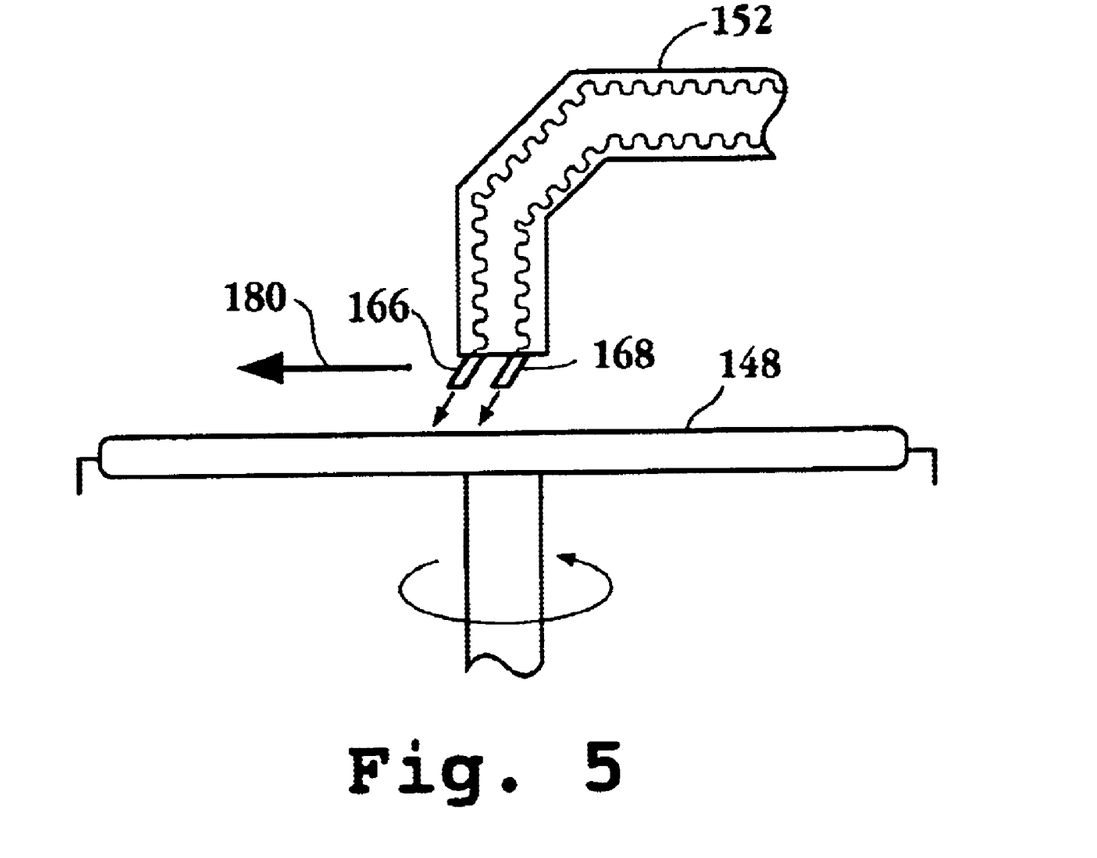
FIG. 5 provides a detailed view of dispense nozzles positioned over a substrate in accordance with one embodiment of the invention.

FIG. 5 provides a detailed view of dispense nozzles 166 and 168 positioned over substrate 148 in accordance with one embodiment of the invention. Dispense arm 152 traverses a path radially across the surface of the substrate 148 in a plane above the substrate as indicated by arrow 180. Therefore, as the substrate 148 is spinning about its axis, nozzles 166 and 168 are directing a flow of rinsing agent and a flow of drying agent across the surface of the substrate 148. By rinsing the cleaning chemistry and immediately drying the surface of the substrate 148, the corrosion inhibitors of the cleaning chemistry do not remain on the surface of the substrate 148 in a diluted state unable to inhibit corrosion effects. Since galvanic corrosion can be initiated in a matter of seconds, the immediate drying of the substrate reduces or prevents the onset of the corrosion effects as the substrate is quenched as described above.

Figure 6:
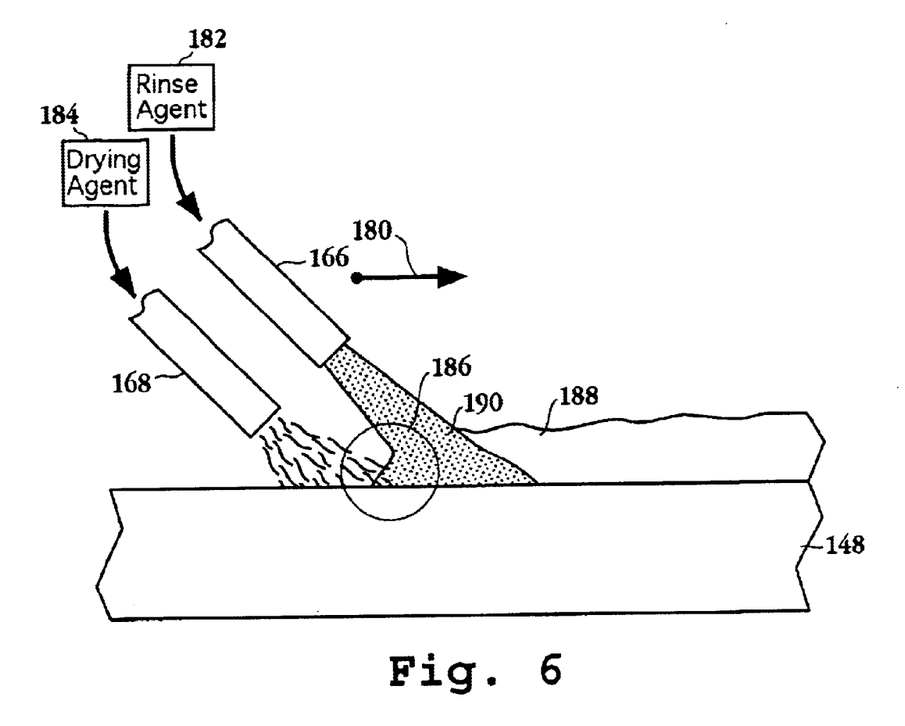
FIG. 6 illustrates a detailed diagram of the surface of the substrate in the region where the rinsing agent and drying agent are impinging on the surface of the substrate to remove a cleaning chemistry layer in accordance with one embodiment of the invention.

FIG. 6 illustrates a detailed diagram of the surface of the substrate 148 in the region where the rinsing agent 182 and drying agent 184 are impinging on the surface of the substrate 148 to remove a cleaning chemistry layer 188 in accordance with one embodiment of the invention. Rinsing agent 182 is applied through dispense nozzle 166 simultaneously while drying agent 184 is applied through dispense nozzle 168. In one embodiment, the nozzles 166 and 168 are positioned so that the fluid streams 190 and 192, emanating from nozzles 166 and 168, respectively, are directed at an angle to the surface of the substrate 148 and in the same plane as the direction of the movement 180 of the dispense arm. The rinsing agent 182 is applied ahead of the drying agent 184 to a top surface the spinning substrate 148 while moving from a center region of the substrate 148 towards a periphery region of the substrate 148. The rinsing agent is configured to rinse the surfaces of the substrate 148 to remove the cleaning chemistry layer 188. In one embodiment, the rinsing agent is DIW. The drying agent is formulated such that it reduces the surface tension of the rinsing agent and the movement of the liquid and residue is enhanced thereby drying the surfaces of the substrate quickly, without allowing a diluted region of the cleaning chemistry layer to remain on the surface of the substrate 148.

It should be appreciated that by simultaneously applying the drying agent 184 and the rinsing agent 182 of FIG. 6, the substrate surface is quickly dried so that any region containing a mixture of the cleaning chemistry and the rinsing agent 182 is minimized. Moreover, by simultaneously applying the rinsing agent 182 and the drying agent 184, the surface of the substrate 148 is quickly dried. Therefore, even if the diluted region of the cleaning chemistry is formed, it is quickly dried without allowing the opportunity for corrosion effects to initiate.

Figure 7:
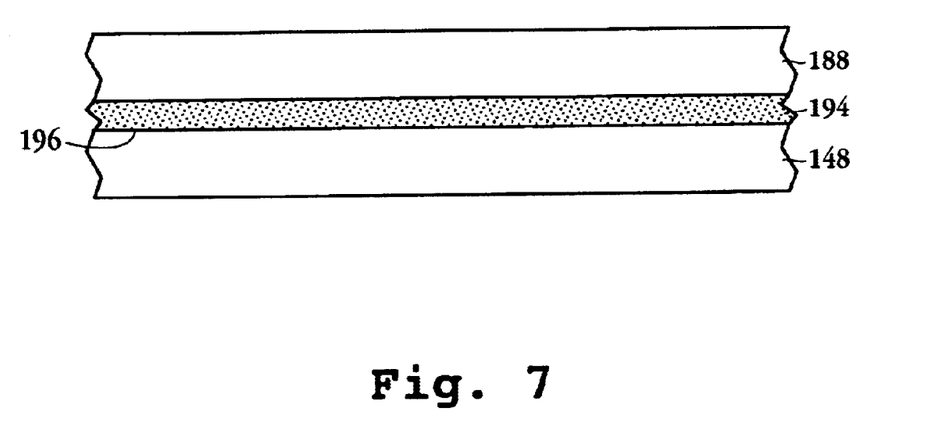
FIG. 7 illustrates a diagram providing a detailed view of the interface between the substrate and the cleaning chemistry layer in accordance with one embodiment of the invention.

FIG. 7 illustrates a diagram providing a detailed view of the interface 194 between the substrate 148 and the cleaning chemistry layer 188 in accordance with one embodiment of the invention. Substrate surface 196 contains a residue from a previous operation, such as etch or CMP in one embodiment. During a single-wafer cleaning operation, the cleaning chemistry applied to the substrate surface 196 is configured to quickly dissolve the residue to enable rinsing the residue from the surface of the substrate. The cleaning chemistry typically includes at least a solvent to dissolve organic materials, a chelator to dissolve metals and a surfactant to inhibit corrosion. As mentioned above, the cleaning chemistry is precisely formulated for the single-wafer cleaning process to be fast acting. The pH, concentration of the chemical species and the concentration of water of the semi-aqueous cleaning chemistries are carefully formulated to provide the desired cleaning result. Additionally, the reactions taking place at the interface 194 occur in seconds.

Therefore, at the interface 194 of FIG. 7 as the cleaning chemistry is dissolving or reacting with the residues from a previous operation, the chemical equilibrium is shifted, which in turn retards the activity of the cleaning chemistry. The reactant species resulting from the chemical reactions occurring at the interface 194 reduces the concentration gradient between the active chemicals of the cleaning chemistry and the residue with which the cleaning chemistry is interacting. Therefore, in another embodiment of the invention, a chemical sequencing method is employed to refresh the concentration gradient. As will be explained in reference to FIG. 9, the chemical sequencing operation includes applying the cleaning chemistry to the substrate for a specified time period, quickly removing the cleaning chemistry as discussed above with reference to FIGS. 4–6 and repeating the applying and removing. In this embodiment, while the cleaning chemistry is applied at least twice, the absolute amount of cleaning chemistry used is not increased. For example, where the cleaning chemical is applied twice, each application uses half the amount as when the cleaning chemistry is applied once as explained in reference to FIG. 9. In another embodiment, the cleaning chemistry is recycled, i.e., as it is removed from the surface of the substrate it is captured and re-applied to the surface of the substrate. It should be appreciated that as the cleaning chemistry is continuously sprayed on the surface of the substrate, the concentration gradient remains substantially constant.

Figure 8:
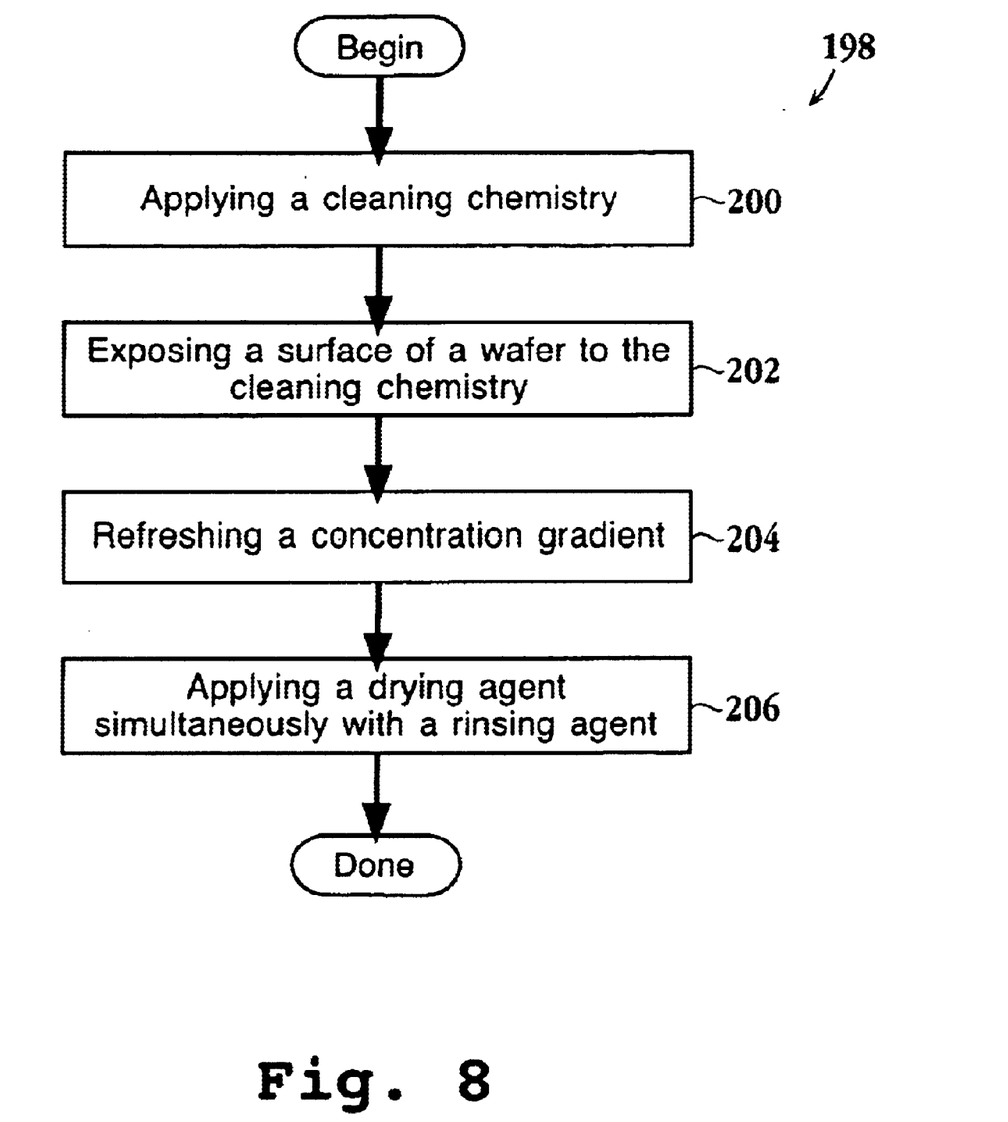
FIG. 8 illustrates a flowchart depicting a method for minimizing galvanic corrosion effects in a single-wafer cleaning system in accordance with one embodiment of the invention.

FIG. 8 illustrates flowchart 198 depicting a method for minimizing galvanic corrosion effects in a single-wafer cleaning system in accordance with one embodiment of the invention. Flowchart 198 initiates with operation 200 where a cleaning chemistry is applied to the wafer (also referred to as a semiconductor substrate). In one embodiment the cleaning chemistry includes a surfactant for inhibiting corrosion. In another embodiment, the surfactant protects the wafer from galvanic corrosion. One skilled in the art would appreciate that the cleaning chemistry can be puddled in a bulk application or sprayed on the wafer continuously. The method then advances to operation 202 where the wafer is exposed to the cleaning chemistry for a defined period of time. In one embodiment, the cleaning chemistry for a single-wafer cleaning method is designed to dissolve the residues between about 30 seconds to about one minute. The method then proceeds to operation 204 where a concentration gradient is refreshed. Here, the gradient between the cleaning chemistry and the residue at an interface of the wafer is refreshed by continuously spraying the cleaning chemistry onto the surface of the wafer in one embodiment. In another embodiment, the continuously sprayed cleaning chemistry is collected as it falls off the surface of the spinning wafer and recycled. For example, the drip tray of FIG. 4 can collect the cleaning chemistry for recycling. In another embodiment, the concentration gradient is refreshed through a chemical sequencing process where the cleaning chemistry is puddled or sprayed onto the substrate for a period of time and then removed. Fresh cleaning chemistry is then applied again to the substrate to refresh the concentration gradient.

The method of FIG. 8 then advances to operation 206 where a rinsing agent and a drying agent are applied simultaneously to the surface of the wafer to remove the cleaning chemistry. In operation 206 the cleaning chemistry is removed quickly i.e., without allowing a diluted region of surfactant to remain on the wafer for a period of time which allows for corrosion to occur on the wafer. In one embodiment, the rinsing agent and the drying agent are applied as discussed with respect to FIGS. 4–6. In another embodiment, the rinsing agent is one of DIW, or any other liquid which can displace and quench the cleaning chemistry such as isopropyl alcohol, and the drying agent is one of IPA, IPA vapor, nitrogen, heated nitrogen or other inert gas.

Figure 9:
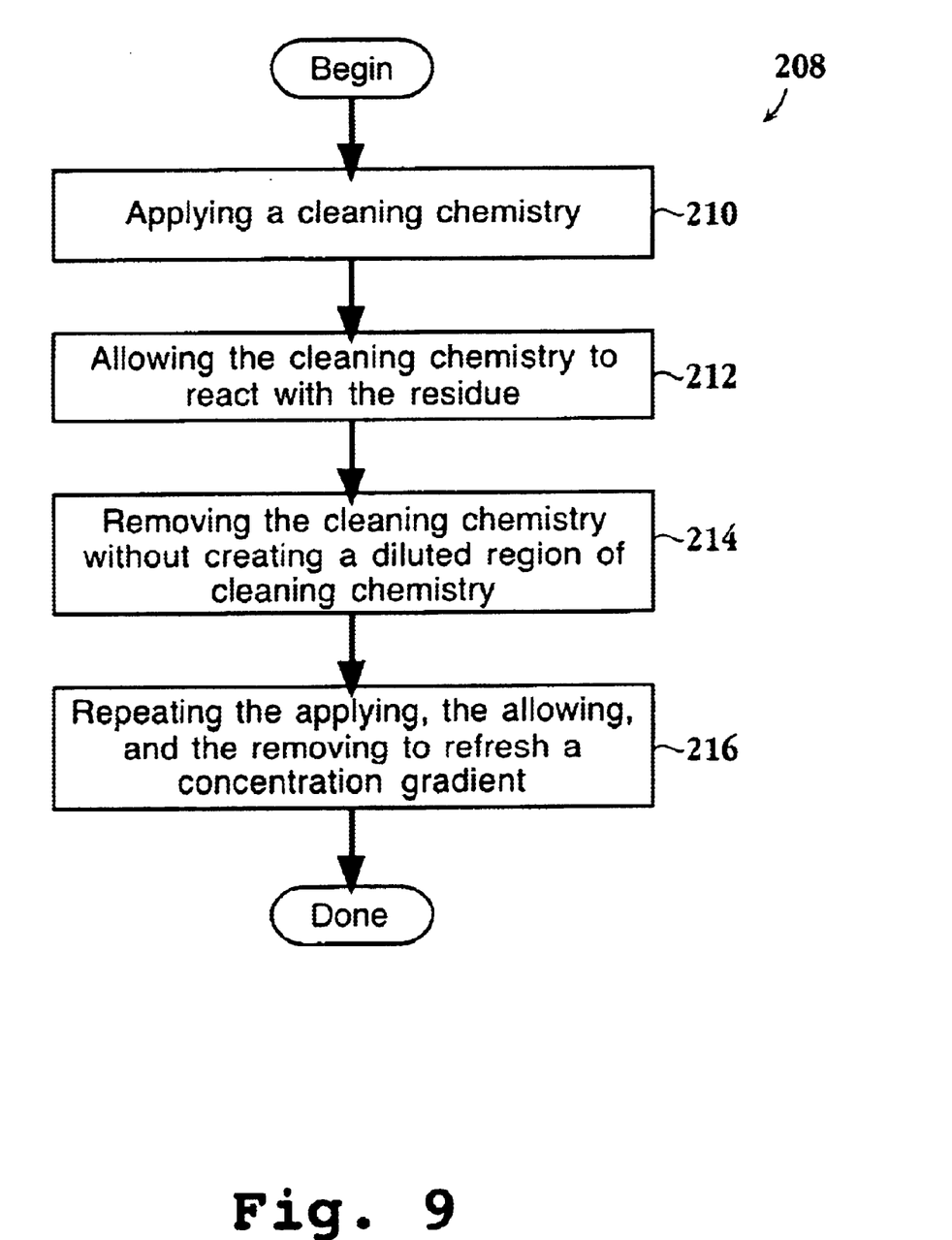
FIG. 9 illustrates a flowchart depicting a chemical sequencing method for single-wafer cleaning of a residue on a semiconductor substrate in accordance with one embodiment of the invention.

FIG. 9 illustrates flowchart 208 depicting a chemical sequencing method for single-wafer cleaning of a residue on a semiconductor substrate in accordance with one embodiment of the invention. The method initiates with operation 210 where a cleaning chemistry is applied to a surface on the semiconductor substrate. In one embodiment, the cleaning chemistry is one of NE-14 and NE-89 from Ashland Inc. of Dublin, Ohio and EKC 640 from EKC Technology, Inc. of Hayward, Calif. In another embodiment, the single-wafer cleaning method is being applied after an etch or CMP operation which leaves residues on the surface of the semiconductor substrate. The method then advances to operation 212 where the cleaning chemistry is allowed to react with the residue on the surface of the semiconductor substrate. Here, the cleaning chemistry resides on the surface of the wafer for a defined period of time to dissolve the residue. In one embodiment, the defined period of time is between about 30 seconds and about one minute.

The method of flowchart 208 then moves to operation 214 where the cleaning chemistry is removed quickly to reduce exposure of the semiconductor substrate to corrosion. In one embodiment, the cleaning chemistry is removed quickly as described in reference to FIGS. 4–6 where a rinsing agent and a drying agent are simultaneously applied to the surface of the semiconductor substrate to remove the cleaning chemistry. The method then advances to operation 216 where operations 210, 212 and 214 are repeated. The concentration gradient is refreshed by repeating operations 210, 212 and 214, so that the activity of the cleaning chemistry is not diminished by the build-up of reactant species at the interface between of the cleaning chemistry and the surface of the semiconductor substrate. As described with reference to FIG. 7, a reactant species resulting from the chemical reactions occurring at the interface reduces the concentration gradient between the active chemicals of the cleaning chemistry and the residue with which the cleaning chemistry is interacting. Thus, the chemical equilibrium under which the cleaning chemistry is most effective is shifted by this build-up.

By refreshing the cleaning chemistry, the optimal chemical equilibrium is re-established. In one embodiment, the method of flowchart 208 consumes substantially the same amount of cleaning chemistry as a single application process. More specifically, if the single application process consumes about 10 ml to about 100 ml, then the chemical sequencing operation where the cleaning chemistry is removed once and re-applied consumes half the amount for each application i.e., between about 5 ml to about 50 ml. Therefore, the absolute quantity of cleaning chemistry consumed does not increase. Additionally, the total amount of time for the single-wafer cleaning method of flowchart 208 is substantially the same as for a single application of the cleaning chemistry. Since the concentration gradient is refreshed, the summation of the residence time for the cleaning chemistry for each application of the chemical sequencing method is substantially similar to the single application residence time. For example, the processing time for a chemical sequencing operation where the cleaning chemistry is applied, then removed and re-applied is substantially similar to the processing time of a single application of the cleaning chemistry. That is, the cleaning chemistry for the chemical sequencing is applied twice, however, each application has a residence time of about half of the residence time for the single application, since the gradient is refreshed in between applications during chemical sequencing. Therefore, the total processing time remains substantially similar.

It should be appreciated that more than two applications of the cleaning chemistry may be utilized. For example, the cleaning chemistry may be applied three or more times in one embodiment. In this embodiment, the amount of cleaning chemistry consumed remains substantially similar as well as the processing time when compared to the single application. In another embodiment, the cleaning chemistry can be continually applied to the surface of the semiconductor substrate. Here, the cleaning chemistry sprayed or puddled onto the surface of the substrate is recycled as it is removed from the substrate surface. In this embodiment the concentration gradient would be continually refreshed.

In yet another embodiment of the invention, the cleaning chemistry is applied to the substrate using the apparatus of FIGS. 4–6. Here, the cleaning chemistry is applied to the surface of the substrate simultaneously with the drying agent i.e., the cleaning chemistry replaces the rinsing agent. For example the cleaning chemistry is initially applied to the substrate and exposed to the substrate for a period of time. Here the cleaning chemistry can be puddled, sprayed or continuously sprayed and recycled for a period of time as discussed above. In the continuous spray mode, the cleaning chemistry is recycled to refresh the concentration gradient continuously in one embodiment. After the period for the exposure is complete the cleaning chemistry is rinsed form the wafer using the apparatus as described in reference to FIGS. 4–6. In one embodiment, the cleaning chemistry replaces DI water or any liquid which is used to displace and quench the cleaning chemistry as a rinsing agent.

For the embodiment where the cleaning chemistry replaces the rinsing agent discussed above, it should be appreciated that the cleaning chemistry will be easily captured and recycled if desired. In turn, the waste effluent quantity would be reduced as the cleaning chemistry is not diluted with DI water or other rinsing agent, thus the cleaning chemistry can be recycled and reused. Furthermore, galvanic corrosion effects would be minimized as the cleaning chemistry is not diluted by the rinsing agent. Therefore, the chemical equilibrium established for the surfactants or corrosion inhibitors of the cleaning chemistry is maintained and refreshed to control galvanic corrosion effects.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for minimizing galvanic corrosion effects in a single-wafer cleaning system, the method comprising:

spraying a cleaning chemistry containing corrosion inhibitors onto a surface of a wafer, exposing the surface of the wafer to the cleaning chemistry for a period of time;

refreshing a concentration gradient at an interface of the cleaning chemistry and the surface of the wafer; and applying a rinsing agent and a drying agent simultaneously from independent nozzles angled toward an outer edge of the wafer above the wafer while the wafer is rotating to remove the cleaning chemistry, wherein the rinsing agent is different than the cleaning chemistry and the drying agent dries the surface of the wafer prior to a concentration of the corrosion inhibitors being diluted to a level insufficient to provide corrosion protection.

2. The method of claim 1, wherein the rinsing agent is de-ionized water.

3. The method of claim 1, wherein the drying agent is isopropyl alcohol.

4. The method of claim 1, wherein the drying agent reduces the surface tension of the rinsing agent.

5. The method of claim 1, wherein the rinsing agent and the drying agent are sprayed radially across the surface of the substrate from a center of the substrate to an edge of the substrate while the substrate is rotating.

6. The method of claim 1, wherein the refreshing further includes:

spraying additional cleaning chemistry onto the surface of the wafer.

7. A method for drying a surface of a semiconductor substrate, the method comprising:

spraying a cleaning chemistry including a surfactant to the surface of the semiconductor substrate;

exposing the surface of the semiconductor substrate to the cleaning chemistry for a defined time period;

maintaining a concentration gradient between the cleaning chemistry and a residue on the surface of the semiconductor substrate; and applying a rinsing agent and a drying agent simultaneously to the surface of the semiconductor substrate from independent nozzles angled toward an outer edge of the semiconductor substrate above the semiconductor substrate while the semiconductor substrate is rotating to remove the cleaning chemistry, wherein the rinsing agent is different than the cleaning chemistry and the drying agent inhibits a diluted region of the cleaning chemistry from residing on the surface of the semiconductor substrate for a time period sufficient to allow corrosion of the substrate.

8. The method of claim 7, wherein the corrosion is galvanic corrosion.

9. The method of claim 7, wherein the cleaning chemistry includes a solvent and a chelator in a semi-aqueous solution.

10. The method of claim 7, wherein the defined time period is between about 30 seconds and about one minute.

11. The method of claim 7, wherein exposing the surface of the semiconductor substrate further includes:

rotating the semiconductor substrate;

continuously adding the cleaning chemistry to the surface of the semiconductor substrate;

collecting the cleaning chemistry spun off the semiconductor substrate; and recycling the cleaning chemistry being added to the surface of the semiconductor substrate.

12. The method of claim 7, wherein the rinsing agent and the drying agent are applied radially across the semiconductor substrate from a center region of the semiconductor substrate to a peripheral region of the semiconductor substrate.

13. A chemical sequencing method for single-wafer cleaning of a residue on a surface of a semiconductor substrate, the chemical sequencing method configured to maintain a concentration gradient at an interface between a cleaning chemistry and a residue on the semiconductor substrate, the method comprising:

a) spraying a cleaning chemistry containing a corrosion inhibitor to the surface of the semiconductor substrate, while the semiconductor substrate is rotating;

b) allowing the cleaning chemistry to react with the residue;

c) removing the cleaning chemistry in a manner that reduces exposure of the semiconductor substrate to galvanic corrosion through simultaneous application of a rinsing agent and a drying agent from independent nozzles angled toward an outer edge of the semiconductor substrate above the semiconductor substrate while the semiconductor substrate is rotating; and repeating a, b and c such that the concentration gradient is refreshed to more effectively remove a remaining residue on the surface of the semiconductor substrate.

14. The method of claim 13, wherein the rinsing agent is deionized water and the drying agent is isopropyl alcohol.

15. The method of claim 14, wherein the rinsing agent and the drying agent are applied radially across the surface of the semiconductor substrate from a center of the semiconductor substrate to an edge of the semiconductor substrate.

16. The method of claim 14, wherein the drying agent reduces a surface tension of the rinsing agent.

17. A method for minimizing galvanic corrosion effects in a single-wafer cleaning system while maintaining a concentration gradient at an interface between a cleaning chemistry and a residue on a wafer, the method comprising:

spraying the cleaning chemistry containing corrosion inhibitors onto a surface of a wafer;

exposing the surface of the wafer to the cleaning chemistry for a period of time;

refreshing a concentration gradient at an interface of the cleaning chemistry and the surface of the wafer by spraying additional cleaning chemistry onto the surface of the wafer; and rinsing the wafer with the cleaning chemistry and simultaneously drying the wafer with a drying agent to remove the cleaning chemistry from the surface of the wafer, wherein the spraying, the rinsing and the drying occur while the wafer is rotating.

18. The method of claim 17, wherein the refreshing a concentration gradient includes:

continuously spraying the cleaning chemistry onto the surface of the wafer for the period of time; and recycling the cleaning chemistry as the cleaning chemistry is sprayed onto the surface of the wafer.

19. The method of claim 17, further including:

maintaining a chemical equilibrium established for the corrosion inhibitors.

20. The method of claim 17, wherein the spraying, the rinsing, and the drying occur without transporting the rotating wafer.

* * * * *